United States Patent [19]
Yamazaki

[11] Patent Number: 5,579,270
[45] Date of Patent: Nov. 26, 1996

[54] FLASH EEPROM WITH AUTO-FUNCTION FOR AUTOMATICALLY WRITING OR ERASING DATA

[75] Inventor: Akihiro Yamazaki, Sagamihara, Japan

[73] Assignee: Kabushiki Kaisha Toshiba, Kawasaka, Japan

[21] Appl. No.: 428,696

[22] Filed: Apr. 25, 1995

[30] Foreign Application Priority Data

Apr. 27, 1994 [JP] Japan .................................. 6-089495

[51] Int. Cl.$^6$ ..................................................... G11C 7/00
[52] U.S. Cl. ............... 365/201; 365/185.14; 365/185.22; 365/185.29
[58] Field of Search .............................. 365/201, 185.14, 365/185.22, 185.29

[56] References Cited

U.S. PATENT DOCUMENTS 5,053,990  10/1991  Kreifels et al. ......................... 364/900
5,233,562  8/1993   Ong et al. ............................... 365/218

FOREIGN PATENT DOCUMENTS

4309814A1  3/1992  Germany.

OTHER PUBLICATIONS

"ISSCC91/Session 16/Non–Volatile And Specialty Memory/Paper FA 16.1" 1991 IEEE International Solid-–State Circuits Conference, pp. 260–261 (1991).

Primary Examiner—David C. Nelms
Assistant Examiner—F. Niranjan
Attorney, Agent, or Firm—Finnegan, Henderson, Farabow, Garrett & Dunner, L.L.P.

[57] ABSTRACT

A non-volatile semiconductor memory with an auto-function for automatically writing or erasing data includes a logic circuit, a select circuit and a test-mode control section. The test-mode control section responds to a plurality of signals transmitted from the outside of the memory for outputting a second verify signal indicating that a verify result is normal, a third verify signal indicating that the verify result is abnormal, and a select signal for selecting an external clock signal from the outside of the memory. The logic circuit forcibly sets to a predetermined value a first verify signal output from a verify circuit on the basis of the second and third verify signals output from the test-mode control section. The select circuit selects, in a normal mode, a clock signal output from an oscillator, and selects, in a test mode, the external clock signal. The number of repetitions of retrial is set irrespective of the verify signal output from the verify circuit.

20 Claims, 4 Drawing Sheets

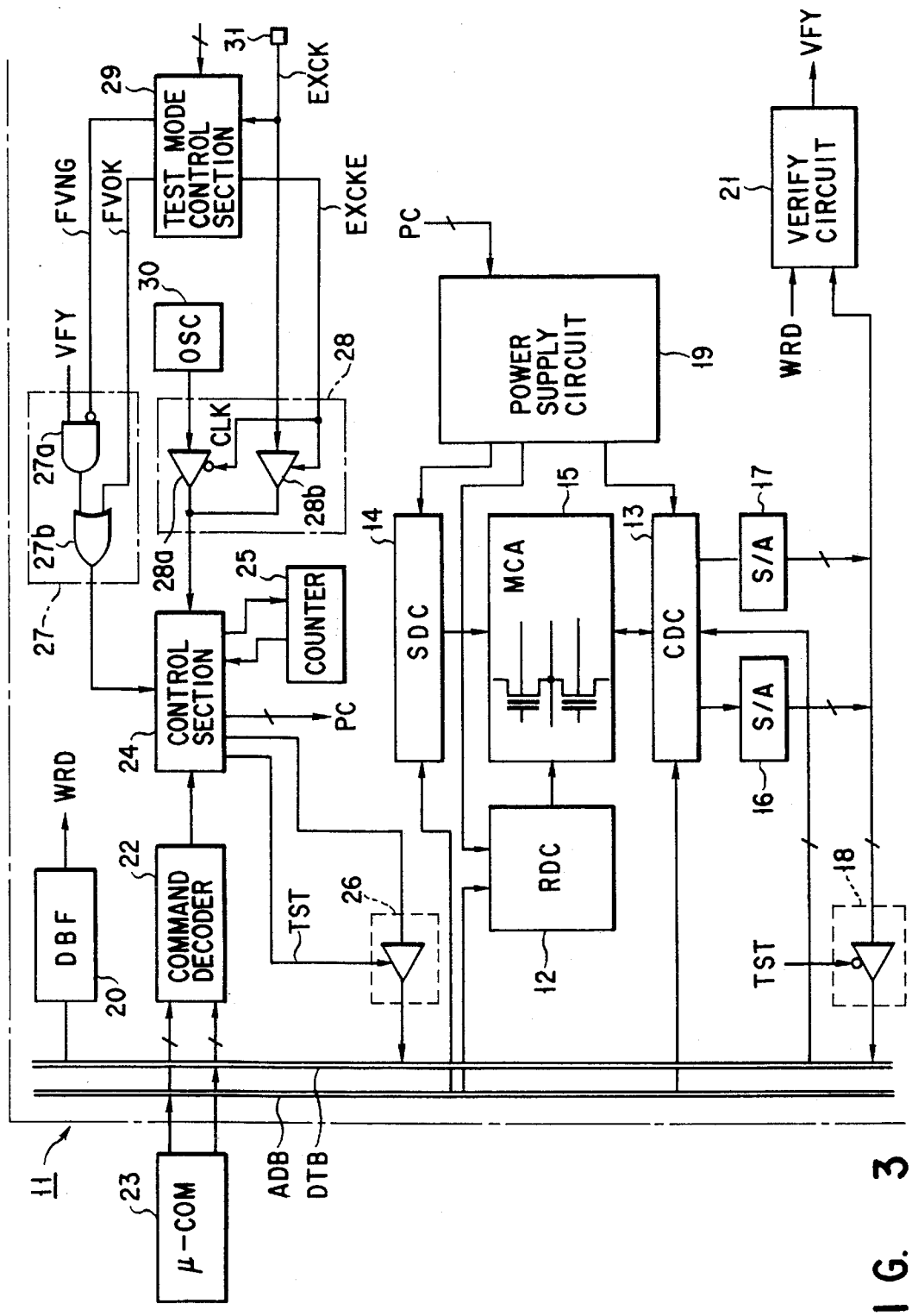
F I G. 3

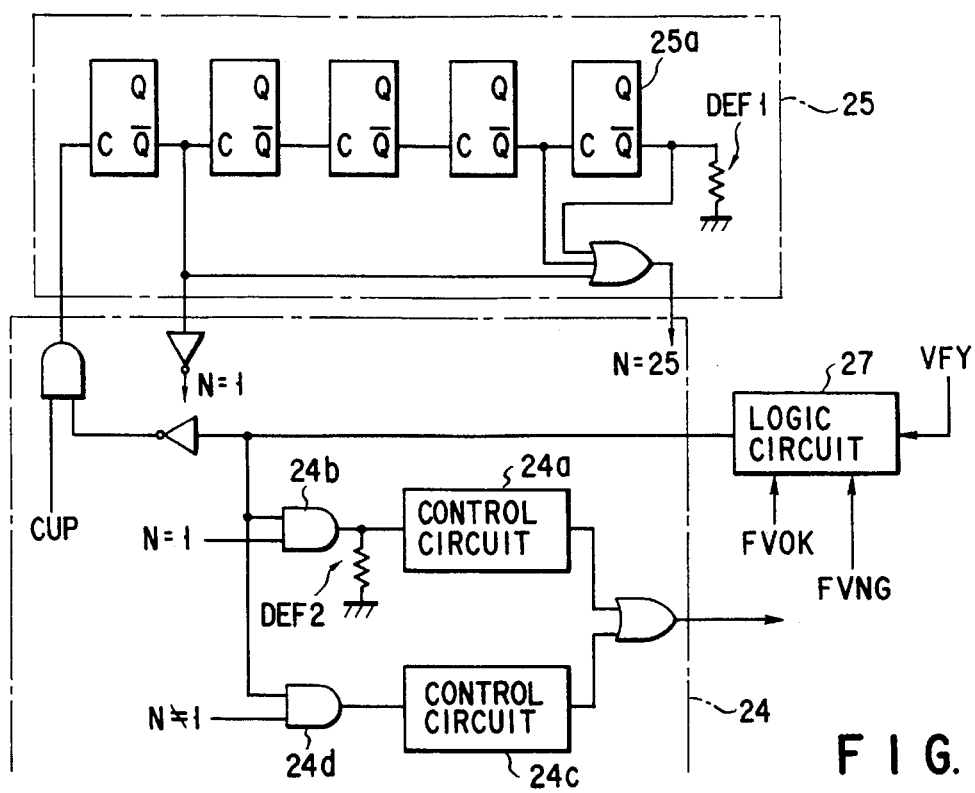
F I G. 5
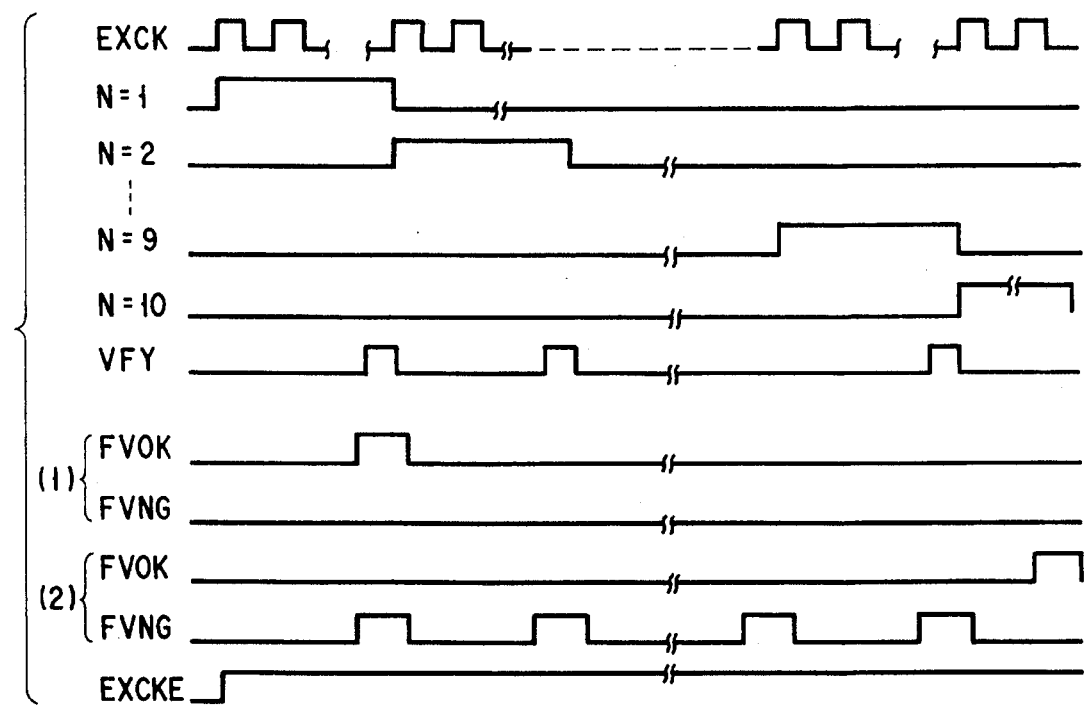
F I G. 6

FLASH EEPROM WITH AUTO-FUNCTION FOR AUTOMATICALLY WRITING OR ERASING DATA

BACKGROUND OF THE INVENTION

1. Field of the Invention

This invention relates to a non-volatile semiconductor memory such as a flash EEPROM (Electrically Erasable Programmable Read Only Memory) which has an auto-function for automatically writing or erasing data.

2. Description of the Related Art

Recently, flash EEPROMs (hereinafter referred to as "flash memories") have been widely developed and used as memory cards or in place of magnetic disk devices. Flash memories of this type are each controlled by a processor installed in an apparatus together with the memory. Many of the flash memories have auto-functions (program and erase sequence controller) for reducing the amount of load applied to processors. One of the flash memories with auto-functions is disclosed, for example, in 1991 IEEE International Solid-State Circuits Conference DIGEST OF TECHNICAL PAPERS pp. 260 and 261 Nakayama et al. "A 60 ns 16 Mb Flash EEPROM with Program and Erase Sequence Controller".

The auto-function enables the flash memory to automatically perform a sequence of data-write/erase operations therein. Specifically, upon receiving from the processor a command for causing the flash memory to perform a predetermined write or erase operation, the flash memory operates in accordance with the command and transmits a status signal indicative of whether or not it has been normally operated. Thus, what the processor does after transmitting the command to the flash memory is only to wait for the status signal from the memory and estimate the value of the status signal. This means the processor performs only simple processing. Further, the flash memory, which operates independent of the operation of the processor, can perform delicate control.

FIG. 1 is a flowchart showing a sequence of operations performed by the auto-function of the flash memory. The flash memory first analyzes a command transmitted from the processor (step ST1). If the command indicates that data should be written in a memory cell with a predetermined address, the flash memory latches the address and data, and performs a set-up operation for setting a programming voltage (step ST2). Thereafter, a busy signal indicating that the flash memory is now operating is outputted, and the counter is cleared (N=0) (step ST3). Subsequently, a write pulse indicative of the programming voltage is transmitted to the designated memory cell, thereby executing a predetermined program for e.g. 10 µs. Then, the value of the counter is incremented (N=N+1) (step ST4). After the program is terminated, the data written in the memory cell is read and verified (step ST5). If it is determined, as a result of verify, that the data has been correctly (normally) written, a status signal indicative of the termination of normal writing is set (step ST6), and the busy signal is reset (step ST7). On the other hand, if it is determined that the data has been incorrectly written, the same data is rewritten into the same memory cell, and verify is performed again. The rewrite and re-verify, which will hereinafter be called "retrial", is repeated 25 times at maximum (N=25) (step ST8). If the verify operation does not show a good result during 25 repetitions of retrial, the status signal indicative of the termination of normal write is not set, and only the busy signal is reset (step ST7). The processor determines that the write operation has been normally terminated if the status signal transmitted from the flash memory is set, and determines that the write operation has failed if the status signal is not set.

Conventional semiconductor memories as described above are subjected to various examinations after being manufactured, in order to eliminate defects therein. In the case of the memories other than the flash memories, each of which has a control circuit simple in structure as compared with the flash memories, most transistors employed in each memory can be activated by performing various write/read operations in all memory cells, thereby detecting defects in the memory at a detection rate of almost 100%. On the other hand, the flash memory with the auto-function has a complicated control circuit for performing various operations therein. Moreover, the auto-function executes write or erase in a predetermined sequence, and whether or not the verify result obtained after programming is normal depends upon the characteristics (write and erase characteristics) of each memory cell. Therefore, it is possible depending upon the memory cell characteristics that only part of the control circuit operates, and it is difficult to activate the entire control circuit. Accordingly, the detection rate of a defect is inevitably low.

For example, as is shown in FIG. 2, there can be a defect DEF1, as indicated by an equivalent resistor, at the output terminal of a flip-flop circuit 25a located in the last stage of a counter 25 for counting the number of repetitions of retrial. Further, there can be a defect DEF2, as indicated by an equivalent resistor, in the input stage of a control circuit 24a for setting a status signal when the first-time write operation has been terminated. In these cases, it is difficult to detect the defects DEF1 and DEF2, depending upon the memory cell characteristics.

More specifically, if there is no defect in the circuit, the flip-flop circuit 25a located in the last stage of the counter 25 generates a low-level signal when retrial has been repeated 16 times. On the other hand, in the case where there is the defect DEF1 at the output terminal of the flip-flop circuit 25a, the value of the counter 25 becomes 25 (N=25) when retrial has been repeated, for example, 9 times, followed by the termination of the program. Accordingly, if all memory cells of the memory have good write characteristics in which data can be correctly written in each of the memory cells in one routine of the program, the flip-flop circuit 25a does not operate and hence the defect DEF1 cannot be detected. Only where the memory has a memory cell which needs more than 9 repetitions of retrial, the defect DEF1 can be detected.

On the other hand, an AND circuit 24b connected to the input terminal of the control circuit 24a outputs a high-level signal when a high-level signal indicative of normal writing has been output from the verify circuit 21, and when a signal indicative of first-time writing has been output from the counter 25. Accordingly, if the memory cells can perform normal write in one write routine, the defect DEF2 can be detected. If, however, the memory cells have bad write characteristics in which they need 5 or 6 repetitions of retrial, the control circuit 24a does not operate and hence the defect DEF2 cannot be detected.

As explained above, in the flash memory with the conventional auto-function, the circuit for executing the auto-function cannot be controlled from the outside, and the determination whether or not the verify result after programming is normal depends upon the write or erase characteristics of memory cells, which makes it difficult to detect defects in the memory in a reliable manner. Moreover, if the flash memory has the defect DEF1 and all memory cells can be programmed by a small number of repetitions of retrial, it can be said that the memory has a satisfactory function in an initial stage. In this case, however, the write and/or erase characteristics of each memory cell will be degraded after a large number of repetitions of retrial, with the result that there is a possibility of occurrence of malfunction due to the defect DEF1. To avoid this, it is requested that a memory with no defects be produced.

SUMMARY OF THE INVENTION

It is an object of the invention to provide a non-volatile semiconductor memory with an auto-function, whose defects can be detected at a high rate.

It is another object of the invention to provide a non-volatile semiconductor memory with an auto-function, in which detects in a control circuit and/or a counter circuit can be detected in a reliable manner.

To attain the above objects, there is provided a non-volatile semiconductor memory comprising: a write circuit for writing data into a non-volatile semiconductor memory cell; an erase circuit for erasing data written in the non-volatile semiconductor memory cell; a verify circuit for verifying data written by the write circuit and the data erased by the erase circuit, thereby outputting a verify signal indicating whether or not data write/erase has been normally performed; a control circuit for controlling the write circuit and the erase circuit in accordance with the verify signal output from the verify circuit; a counter circuit connected to the control circuit for counting the number of repetitions of data write by the write circuit or the number of repetitions of data erase by the erase circuit; and varying circuit connected between the control circuit and the verify circuit for forcibly varying the verify signal output from the verify circuit in a test mode.

In the above-described structure, the verify signal output from the verify circuit is transmitted to the control circuit after its level is forcibly varied by the varying circuit. Since the control circuit performs a write or erase operation in accordance with the varied verify signal, the number of repetitions of write or erase retrial can be set irrespective of the verify signal output from the verify circuit. As a result, all portions of the control circuit and the counter circuit can be traced, and a defect, if any, in the circuits can accordingly be detected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 3 is a schematic circuit diagram, showing a non-volatile semiconductor memory according to the embodiment of the invention;

FIG. 5 is a circuit diagram, showing a circuit section related to a control section and a counter section incorporated in the circuit of FIG. 3; and FIG. 6 is a timing chart, useful in explaining the operation of the circuit elements shown in FIGS. 3–5.

DETAILED DESCRIPTION OF THE PREFERRED EMBODIMENTS

Figure 1:
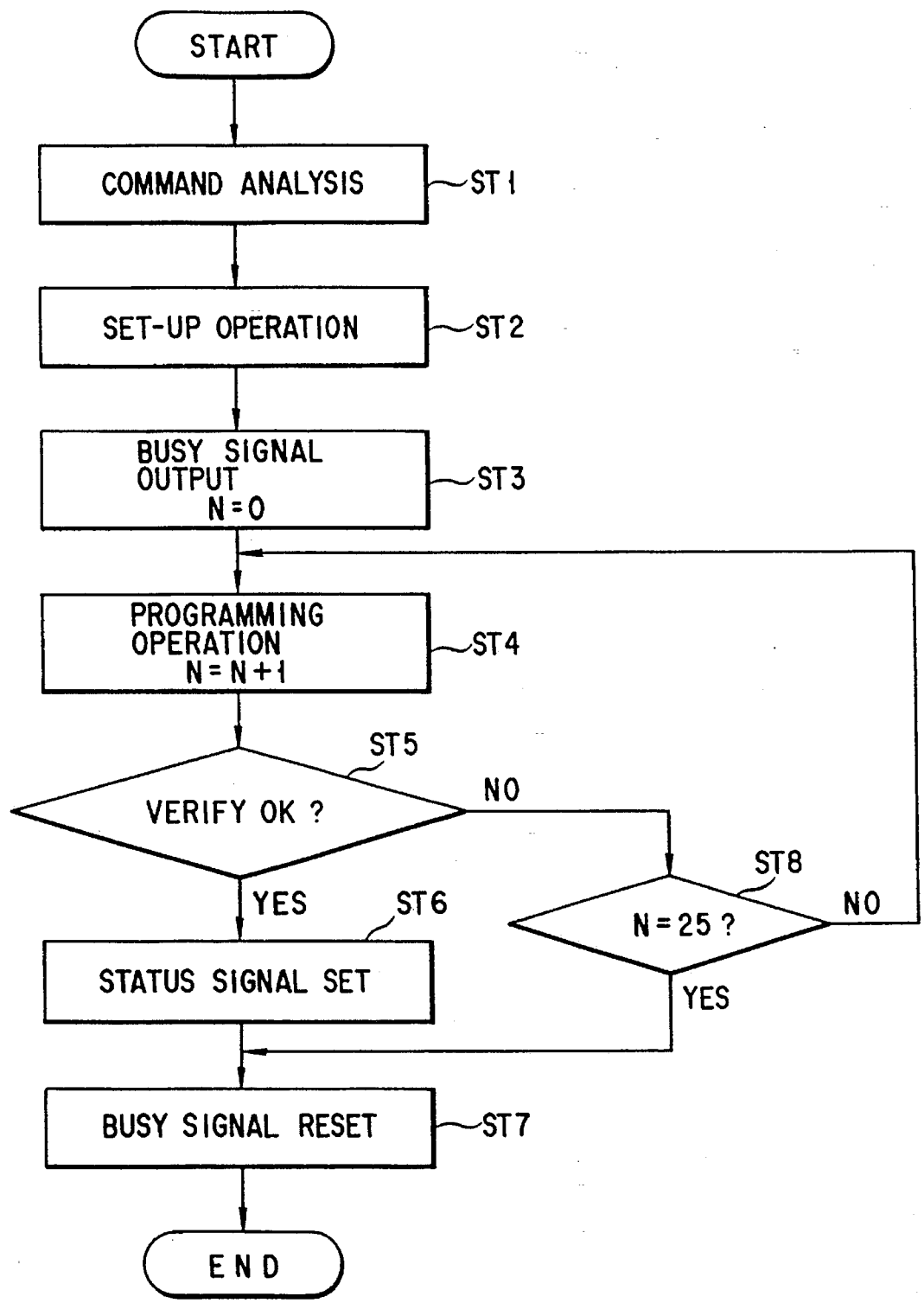
FIG. 1 is a flowchart, useful in explaining the programming of a flash memory.

FIG. 3 is a schematic view, showing a non-volatile semiconductor memory according to the embodiment of the invention. A flash memory 11 includes an address bus ADB and a data bus DTB. The address bus ADB is connected to a row address decoder (RDC) 12, a column address decoder (CDC) 13 and a source decoder (SDC) 14. The row address decoder (RDC) 12, the column address decoder (CDC) 13 and the source decoder (SDC) 14 are connected to a memory cell array (MCA) 15. The memory cell array 15 includes EEPROM cells and words lines, bit lines and source lines, etc. (which are not shown), forming, for example, a NOR type memory cell array. The words lines, the bit lines and the source lines are selected by means of the row address decoder 12, the column address decoder 13 and the source decoder 14. The column address decoder 13 is connected to the data bus DTB for transmitting desired write data to the decoder 13.

The column address decoder 13 is connected to the data bus DTB via sense amplifiers (S/A) 16 and 17 and a first output control section 18. At the time of reading data, data read from the memory cell array 14 is amplified by the sense amplifiers 16 and 17, and transmitted to the data bus DTB via the first output control section 18.

The row address decoder 12, the column address decoder 13 and the source decoder 14 are connected to the power supply circuit 19. The circuit 19 applies a plurality of voltages higher and lower than a power voltage to the row address decoder 12, the column address decoder 13 and the source decoder 14 at the time of data programming and erasion, respectively.

The data bus DTB is connected to a data buffer (DBF) 20, which has an output terminal connected to one of the input terminals of a verify circuit 21. Thus, write data WRD is transmitted to the verify circuit 21. The other input terminal of the verify circuit 21 is connected to the sense amplifiers 16 and 17. At the time of data write, the verify circuit 21 compares write data WRD stored in the data buffer 20 with data units output from the sense amplifiers 16 and 17, and outputs, for example, a high-level verify signal VFY indicating that normal data write has been performed when the compared data units are identical to each other.

The address bus ADB and the data bus DTB are connected to a command decoder 22 and a microcomputer (μ-COM) 23. The microcomputer 23 is contained in each electronic device provided outside the flash memory 11. The command decoder 22 decodes a command consisting of an address signal and data which are transmitted from the microcomputer 23. For example, a program mode, an erase mode, a test mode, etc. are used as commands. The command decoder 22 is connected to a control section 24.

The power supply circuit 19, the counter 25, a second output control section 26, a logic circuit 27 and a selection circuit 28 are connected to the control section 24. The logic circuit 27 is connected to the verify circuit 21 and a test-mode control section 29. The selection circuit 28 is connected to an oscillator (OSC) 30 for generating a clock signal, a terminal 31 for fetching therefrom an external clock signal EXCK, and the verify circuit 21.

The control section 24 responds to a command transmitted from the command decoder 22, for performing control for automatically executing data write or erase in a predetermined program sequence. Specifically, the control section 24 outputs a power supply control signal PC for controlling the power supply circuit 19 at the time of data write or erase. Further, the control section 24 responds to the verify signal VFY transmitted from the verify circuit 21, for controlling the counter 25 and the second output control section 26. Furthermore, the control section 24 sets a status signal or resets a busy signal in accordance with the value of the counter 25. The above-described circuits operate in accordance with clock signals output from the oscillator 30.

The second and first output control sections 26 and 18 are controlled by means of a test signal TST output from the control section 24. Only the first output control section 18 operates in a normal mode, while the second output control section 26 operates in a test mode. The second output control section 26 is connected to the data bus DTB, for supplying the same with the busy signal and the status signal output from the control section 24. The counter 25 counts, during the write operation, the number of repetitions of retrial in response to a clock signal from the oscillator 30 selected by the selection circuit 28.

In the FIG. 3 structure, elements other than the logic circuit 27, the selection circuit 28 and the test-mode control section 29 are identical to those employed in the conventional case. In this embodiment, the logic circuit 27, the selection circuit 28 and the test-mode control section 29 are controlled on the basis of signals transmitted from peripheral circuits in the test mode, thereby forcibly setting the verify signal from the verify circuit 21, to a desired value. As a result, the control section 24 and the counter 25 can trace all circuit.

The test-mode control section 29 operates in response to a plurality of signals transmitted from the outside of the flash memory 11, thereby outputting a verify signal FVOK indicating that the verify result is normal, a verify signal FVNG indicating that the verify result is not normal, or a selection signal EXCKE for selecting the external clock signal. The test-mode control section 29 will be explained later in detail.

The logic circuit 27 responds to the verify signal FVNG or FVOK transmitted from the test-mode control section 29, for forcibly setting the verify signal VFY transmitted from the verify circuit 21, to high level or low level. Specifically, the logic circuit 27 consists of an AND circuit 27a and an OR circuit 27b. The AND circuit 27a has an input terminal for receiving the verify signal VFY output from the verify circuit 21, and the other input terminal for receiving the inverted signal of the verify signal FVNG output from the test-mode control section 29. The logical product of the AND circuit 27a is transmitted to an input terminal of the OR circuit 27b. The verify signal FVOK output from the test-mode control section 29 is transmitted to the other input terminal of the OR circuit 27b. The logical product of the OR circuit 27b is transmitted to the control section 24.

When the verify signal FVNG of high level has been transmitted from the test-mode control section 29 to the logic circuit 27, the output signal of the logic circuit 27 is set to low level even if the verify signal VFY output from the verify circuit 21 is at high level. On the other hand, when the verify signal FVOK of high level has been transmitted from the test-mode control section 29 to the logic circuit 27, the output signal of the logic circuit 27 is set to high level even if the verify signal VFY output from the verify circuit 21 is at low level.

The selection circuit 28 selects one of the clock signal output from the oscillator 30 and the clock signal EXCK output from the outside of the flash memory 11. Specifically, the selection circuit 28 consists of two transfer gates 28a and 28b. The input terminal of the transfer gate 28a is connected to the oscillator 30, while the input terminal of the transfer gate 28b receives the clock signal EXCK. The outputs of the transfer gates 28a and 28b are transmitted to the control section 24. The transfer gate 28a receives the inverted signal of the selection signal EXCKE output from the test-mode control section 29 in the test mode, and the transfer gate 28b receives the selection signal EXCKE.

In the normal mode, the selection circuit 28 selects the output of the oscillator 30 via the transfer gate 28a, and accordingly, the control section 24, etc. are operated in synchronism with the clock signal CLK output from the oscillator 30. Further, in the test mode, the selection circuit 28 selects the external clock signal EXCK via the transfer gate 28b, and accordingly, the control section 24, etc. are operated in synchronism with the external clock signal EXCK output from the outside of the memory.

Figure 4:
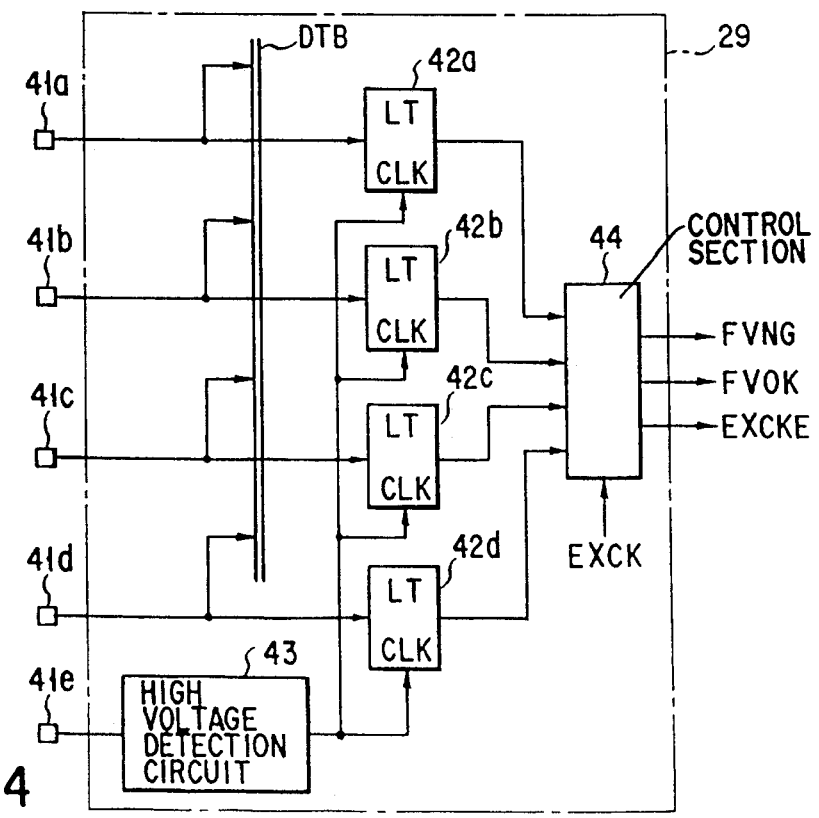
FIG. 4 is a circuit diagram, showing a test-mode control section incorporated in the circuit of FIG.

FIG. 4 shows a detailed structure of the test-mode control section 29 incorporated in the FIG. 3 circuit. Input terminals 41a–41d included in the input terminals 41a–41e of the flash memory 11 are connected, for example, to the data bus DTB and the input terminals of the latch circuit (LT) 42a–42d. The input terminals 41a–41d receive, for example, write data output from the microcomputer 23 in the normal mode, and receives, in the test mode, setting signals for setting the verify signals FVOK and FVNG and the selection signal EXCKE. Each of the setting signals is, for example, a 4-bit signal, which can set the output time point of the verify signal FVOK or FVNG.

The input terminal 41e is connected to a high-voltage detection circuit 43 for receiving a test mode signal indicative of the test mode. The test mode signal has, for example, a higher voltage than the power supply voltage. When the test mode signal has been transmitted to the input terminal 41e, the high-voltage detection circuit 43 detects the test mode signal, and outputs a latch signal. The latch signal is transmitted to the clock signal input terminal CLK of each of the latch circuits 42a–42d, which in turn latch the setting signals at the input terminals 41a–41d. The output terminals of the latch circuits 42a–42d are connected to a control section 44. The control section 44, to which the external clock signal EXCK is transmitted, responds to signals output from the latch circuits 42a–42d for generating the verify signals FVOK and FVNG and the selection signal EXCKE in synchronism with the external clock signal EXCK.

Figure 2:
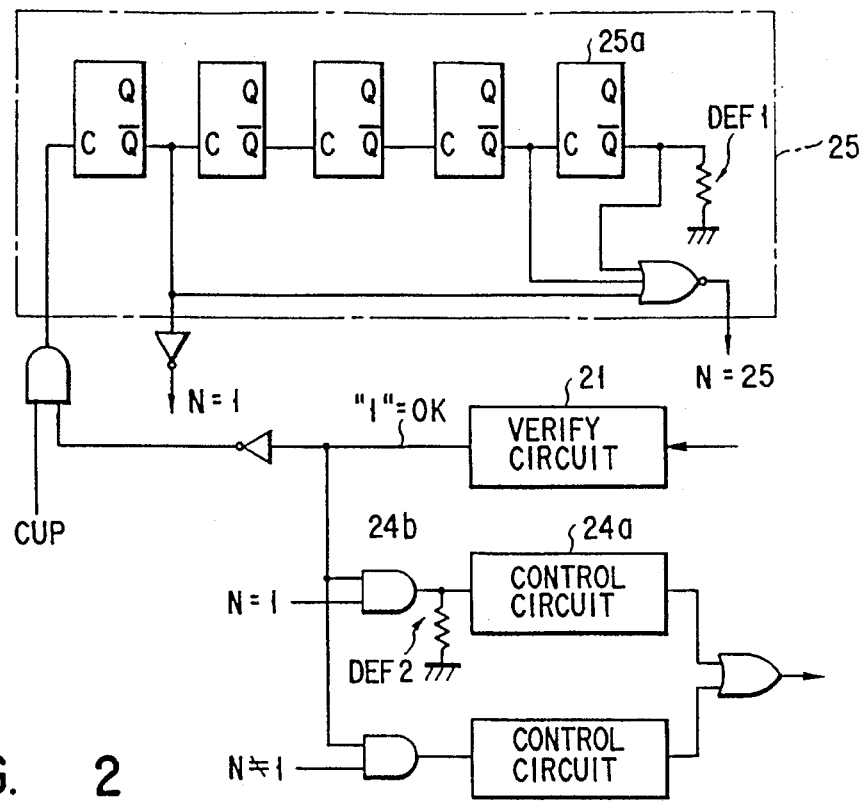
FIG. 2 is a circuit diagram, showing an example of a circuit consisting of a control section and a counter section employed in a conventional flash memory.

FIG. 5 shows an example of a circuit consisting of the control section 24 and the counter 25 shown in FIG. 3. In FIG. 5, elements similar to those in FIGS. 2 and 3 are denoted by corresponding reference numerals. As in the FIG. 2 case, suppose that the FIG. 5 circuit has a defect DEF1, as indicated by an equivalent resistor, at the output terminal of the flip-flop circuit 25a located in the last stage of the counter 25, and a defect DEF2, as indicated by an equivalent resistor, between the input terminal of the control circuit 24a and the output terminal of the AND circuit 24b, which are provided in the control section 24. The control circuit 24a and the AND circuit 24b set a status signal, for example, when the first-time write operation has been normally performed.

The operation of the structure shown in FIGS. 3–5 will be explained with reference to the flowchart of FIG. 6.

When the high-voltage detection circuit 43 has detected the test mode signal, the test-mode control section 29 outputs the verify signals FVOK and FVNG and the selection signal EXCKE at predetermined time points in accordance with the setting signals latched by the latch circuits 42a–42d.

First, an explanation will be given of a case as shown in FIG. 6 (1), where the test-mode control section 29 is set to generate the verify signal FVOK if the value N of the counter 25 is 1. In this case, when the first-time programming operation (write operation) has been executed, the output signal of the logic circuit 27 is set at high level in accordance with the verify signal FVOK, even if the verify circuit 21 has output the low-level verify signal VFY indicating that the programming operation has not normally performed. Accordingly, the control section 24 outputs a status signal indicative of the termination of normal write, without retrial. The status signal is transmitted to the microcomputer 23 via the second output control section 26 and the data bus DTB.

As explained above, even when the first-time programming operation has not normally performed, the test-mode control section 29 generates the verify signal FVOK in accordance with the count value N=1, thereby terminating write without retrial. In other words, since at the end of the first-time programming operation, the input conditions for the AND circuit 24b shown in FIG. 5 are satisfied, the circuit 24b can be traced. As a result, the defect DEF2 at the output terminal of the AND circuit 24b can be detected.

Then, an explanation will be given of a case as shown in FIG. 6 (2), where the test-mode control section 29 is set to generate the verify signal FVNG for the count value N=1, . . . , 9, and to generate the verify signal FVOK for the count value N=10. In this case, when the control section 24 has performed data-programming operation, retrial is repeated and the programming operation is performed again even when the verify circuit 21 has output the high-level verify signal VFY indicative of the termination of normal write. After the tenth-time programming operation is terminated, the output signal of the logic circuit 27 is shifted to high level in accordance with the verify signal FVOK. Accordingly, the control section 24 outputs a status signal indicative of the termination of normal write, to the microcomputer 23 via the second output control section 26 and the data bus DTB. Since the count value of the counter 25 is calculated in synchronism with the external clock signal EXCK, it can be known by determining how many pulses of the external clock signal EXCK there were before normal write is terminated. From the count value, a defective flip-flop circuit can be detected. Therefore, even in a memory with good write characteristics (which needs only a small number of repetitions of retrial), the operation of the last-stage flip-flop 25a of the counter 25 of FIG. 5 can be traced by the control from the outside of the memory, and hence the defect DEF1 at the output terminal of the flip-flop 25a can be detected. Further, at this time, the input conditions for the AND circuit 24d shown in FIG. 5 are satisfied, which enables the trace of the operation of the circuit 24d. As a result, a defect at the output terminal of the AND circuit 24d, if exists, can be also detected.

According to the above-described embodiment, the test-mode control section 29 generates, in the test mode, the verify signals FVOK and FVNG in accordance with set signals transmitted from the outside of the memory, thereby controlling the logic circuit 27. As a result, the verify signal to be transmitted to the control section 24 can be forcibly set to a predetermined value, and the number of the repetitions of retrial can be set by the control from the outside of the flash memory 11, irrespective of the verify signal VFY output from the verify circuit 21. Every element constituting the control section 24 and the counter 25 can be traced by changing the number of repetitions of retrial, with the result that any defect, if exists therein, can be detected in a reliable manner.

Although in the embodiment, the test-mode control section 29 generates the verify signals FVOK and FVNG and the selection signal EXCKE, the invention is not limited to this. If the flash memory 11 has a further terminal, it may be constructed that the verify signals and the selection signal are generated on the outside of the memory without using the test-mode control section 29, and are directly input to that terminal of the memory.

Moreover, although in the embodiment, the defect in the memory is detected in accordance with the data-programming operation, it may be detected in accordance with the data-erase operation. In this case, the counter 25 sets the number of repetitions of erasion, and counts the repetitions of erasion or the repetitions of both programming and erasion.

In addition, although in the embodiment, the invention is applied to a flash memory, it is also applicable to a non-volatile memory such as an EEPROM, etc., in which a sequence of write or read operations are controlled on the basis of verify results.

It is a matter of course that the invention can be modified in various manners without departing from its scope.

What is claimed is:

1. A non-volatile semiconductor memory comprising:

write means for writing data into a non-volatile semiconductor memory cell;

erase means for erasing data written in the non-volatile semiconductor memory cell;

verify means for verifying data written by the write means and the data erased by the erase means, thereby outputting a verify signal indicating whether or not data write/erase has been normally performed;

control means for controlling the write means and the erase means in accordance with the verify signal output from the verify means;

count means connected to the control means for counting the number of repetitions of data write by the write means or the number of repetitions of data erasion by the erase means; and varying means connected between the control means and the verify means for forcibly varying the verify signal output from the verify means in a test mode.

2. The non-volatile semiconductor memory according to claim 1, wherein the varying means has generator means for generating a varying signal for forcibly varying the verify signal, in accordance with an external signal input in the test mode.

3. The non-volatile semiconductor memory according to claim 1, wherein the varying means is controlled by an external varying signal input in the test mode for forcibly varying the verify signal.

4. The non-volatile semiconductor memory according to claim 2, wherein the generator means has detecting means for detecting an external signal indicative of a test mode; holding means for holding an external set signal for varying the verify signal, when the detecting means has detected the test mode; and signal-generating means for generating a varying signal for forcibly varying the verify signal, on the basis of the external set signal held by the holding means.

5. The non-volatile semiconductor memory according to claim 1, further comprising select means connected to the control means, the select means selecting a clock signal output from an oscillator in a normal mode, and selecting an external clock signal in the test mode.

6. A non-volatile semiconductor memory comprising:

a write circuit for writing data into a non-volatile semiconductor memory cell;

an erase circuit for erasing data written in the non-volatile semiconductor memory cell;

a verify circuit for verifying data written by the write circuit and the data erased by the erase circuit, thereby outputting a verify signal indicating whether or not data write/erase has been normally performed;

a control circuit for controlling the write and erase circuits in accordance with the verify signal output from the verify circuit;

a counter circuit connected to the control circuit for counting the number of repetitions of data write by the write circuit or the number of repetitions of data erasion by the erase circuit; and a varying circuit connected between the control circuit and the verify circuit for forcibly varying the verify signal output from the verify circuit in a test mode.

7. The non-volatile semiconductor memory according to claim 6, wherein the varying circuit has a generator circuit for generating a varying signal for forcibly varying the verify signal, in accordance with an external signal input in the test mode.

8. The non-volatile semiconductor memory according to claim 6, wherein the varying circuit is controlled by an external varying signal input in the test mode for forcibly varying the verify signal.

9. The non-volatile semiconductor memory according to claim 7, wherein the generator circuit has a detecting circuit for detecting an external signal indicative of a test mode; a holding circuit for holding an external set signal for varying the verify signal, when the detecting circuit has detected the test mode; and a signal-generating circuit for generating a varying signal for forcibly varying the verify signal, on the basis of the external set signal held by the holding circuit.

10. The non-volatile semiconductor memory according to claim 6, further comprising a select circuit connected to the control circuit, the select circuit selecting a clock signal output from an oscillator in a normal mode, and selecting an external clock signal in the test mode.

11. A non-volatile semiconductor memory comprising:

a memory cell array;

an address bus;

a data bus;

a row address decoder connected to the address bus for selecting a row of memory cells in the memory cell array;

a column address decoder connected to the address bus and the data bus for selecting a column of memory cells in the memory cell array on the basis of a column address in the address bus, thereby supplying the selected column with write data in the data bus;

a sense amplifier connected to the column address decoder for amplifying data read from the memory cell array;

a first output control section for outputting, to the data bus, the data read from the memory cell array and amplified by the sense amplifier;

a power supply circuit for supplying power to the row address decoder and the column address decoder;

a data buffer for temporarily storing write data in the data bus;

a verify circuit for comparing the write data temporarily stored in the data bus, with the data output from the sense amplifier, and outputting a first verify signal when the data units are identical to each other;

a command decoder for decoding a command which includes an address signal transmitted from a microcomputer to the address bus and data transmitted from the microcomputer to the data bus;

a test-mode control section responsive to a plurality of external signals for outputting a second verify signal indicating that the verify result is normal, a third verify signal indicating that the verify result is abnormal, and a select signal for selecting an external clock signal;

an oscillator for generating a clock signal;

a select circuit for selecting one of a clock signal output from the oscillator and the external clock signal, the select circuit selecting the clock signal output from the oscillator in a normal mode, and selecting the external clock signal in a test mode;

a counter for counting, in a normal write, the number of repetitions of retrial in synchronism with the clock signal output from the oscillator selected by the select circuit;

a second output control section connected to the data bus for outputting a busy signal and a status signal to the data bus;

a logic circuit responsive to second and third verify signals transmitted from the test-mode control section, for forcibly setting to a predetermined value the level of a first verify signal transmitted from the verify circuit; and a control section for outputting a power control signal to control the power supply circuit, thereby controlling the counter, the second output control section, the logic circuit and the select circuit, the control section being responsive to a command output from the command decoder for allowing the memory to automatically operate in a predetermined program sequence.

12. The non-volatile semiconductor memory according to claim 11, further comprising a source decoder connected to the address bus for selecting a source line in the memory cell array, the source decoder receiving a power from the power supply circuit.

13. The non-volatile semiconductor memory according to claim 11, wherein the test-mode control section has a plurality of latch circuits for latching, in the test mode, set signals for setting the second and third verify signals and the select signal, a high-voltage detect circuit for receiving a test mode signal of a voltage higher than the power supply voltage to cause the latch circuits to latch the set signals, and a control section responsive to signals output from the latch circuits for generating the second and third verify signals in synchronism with the external clock signal.

14. The non-volatile semiconductor memory according to claim 11, wherein the counter performs count in synchronism with the external clock signal, and is controlled by an output from the logic circuit.

15. The non-volatile semiconductor memory according to claim 11, wherein the counter includes a plurality of flip-flop circuits connected to one another in series and receiving a count-up signal, and an OR circuit for receiving outputs from selected ones of the flip-flop circuits.

16. The non-volatile semiconductor memory according to claim 11, wherein the control section includes a plurality of AND circuits each having an input terminal for receiving an output signal from the logic circuit and the other input terminal for receiving the count value of the counter, a plurality of control circuits for receiving outputs from the AND circuits, respectively, and an OR circuit for receiving outputs from the control circuits and outputting a status signal indicative of the termination of normal write.

17. The non-volatile semiconductor memory according to claim 11, wherein the logic circuit includes an AND circuit which has an input terminal for receiving the first verify signal output from the verify circuit, and the other input terminal for receiving the third verify signal output from the test-mode control section; and an OR circuit which has an input terminal for receiving an output signal from the AND circuit, the other input terminal for receiving the second verify signal output from the test-mode control section, and an output terminal for transmitting an output signal to the control section.

18. The non-volatile semiconductor memory according to claim 11, wherein the select circuit includes a first buffer supplied with a clock signal from the oscillator and controlled by an inverted signal of a select signal for selecting the external clock signal transmitted via the test-mode control section; and a second buffer supplied with the external clock signal and controlled by the select signal.

19. The non-volatile semiconductor memory according to claim 11, wherein the first output control section includes a first buffer controlled by an inverted signal of a test signal output from the control section, and the second output control section includes a second buffer controlled by the signal output from the control section.

20. The non-volatile semiconductor memory according to claim 11, wherein the power supply circuit generates a plurality of higher voltages and a plurality of lower voltages than a power supply voltage during programming and erasing data, respectively.

\* \* \* \* \*